United States Patent
Wu et al.

(10) Patent No.: US 11,056,566 B2
(45) Date of Patent: Jul. 6, 2021

(54) SPLIT GATE MEMORY DEVICE AND METHOD OF FABRICATING THE SAME

(71) Applicant: Taiwan Semiconductor Manufacturing Co., Ltd., Hsin-Chu (TW)

(72) Inventors: Chang-Ming Wu, New Taipei (TW); Wei Cheng Wu, Zhubei (TW); Shih-Chang Liu, Alian Township (TW); Harry-Hak-Lay Chuang, Zhubei (TW); Chia-Shiung Tsai, Hsin-Chu (TW)

(73) Assignee: Taiwan Semiconductor Manufacturing Co., Ltd., Hsinchu (TW)

( * ) Notice: Subject to any disclaimer, the term of this patent is extended or adjusted under 35 U.S.C. 154(b) by 0 days.

(21) Appl. No.: 16/705,508

(22) Filed: Dec. 6, 2019

(65) Prior Publication Data
US 2020/0111881 A1 Apr. 9, 2020

Related U.S. Application Data

(60) Continuation of application No. 16/166,603, filed on Oct. 22, 2018, now Pat. No. 10,516,026, which is a
(Continued)

(51) Int. Cl.
| *H01L 29/423* | (2006.01) |
| *H01L 27/11521* | (2017.01) |
| *H01L 21/28* | (2006.01) |
| *H01L 29/792* | (2006.01) |
| *H01L 27/1157* | (2017.01) |
| *H01L 27/11524* | (2017.01) |

(Continued)

(52) U.S. Cl.
CPC .... *H01L 29/42344* (2013.01); *H01L 27/1157* (2013.01); *H01L 27/11521* (2013.01);
(Continued)

(58) Field of Classification Search
CPC ......... H01L 21/28273; H01L 21/28282; H01L 27/11521; H01L 27/11524;
(Continued)

(56) References Cited

U.S. PATENT DOCUMENTS

| 6,291,297 B1 | 9/2001 | Chen |
| 7,271,061 B2 | 9/2007 | Jeon et al. |

(Continued)

FOREIGN PATENT DOCUMENTS

| JP | 2007258497 A | 10/2007 |

OTHER PUBLICATIONS

Caleb Yu-Sheng Cho, et al.; "A Novel Self-Aligned Highly Reliable Sidewall Split-Gate Flash Memory"; IEEE Transactions on Electron Devices, vol. 53, No. 3, Mar. 2006, p. 465-473.
(Continued)

*Primary Examiner* — Matthew E Warren
(74) *Attorney, Agent, or Firm* — Eschweiler & Potashnik, LLC

(57) ABSTRACT

The present disclosure, in some embodiments, relates to a method of forming a memory cell. The method may be performed by forming a sacrificial spacer over a substrate and forming a select gate along a side of the sacrificial spacer. An inter-gate dielectric is formed over the select gate and the sacrificial spacer. A memory gate layer is formed over the inter-gate dielectric and the sacrificial spacer. The memory gate layer is laterally separated from the sacrificial spacer by the select gate. The memory gate layer is etched to define a memory gate having a topmost point below a top of the sacrificial spacer.

20 Claims, 10 Drawing Sheets

Related U.S. Application Data division of application No. 15/332,115, filed on Oct. 24, 2016, now Pat. No. 10,147,794, which is a continuation of application No. 14/182,952, filed on Feb. 18, 2014, now Pat. No. 9,484,351.

(51) Int. Cl.
*H01L 27/11568* (2017.01)
*H01L 29/66* (2006.01)
*H01L 29/51* (2006.01)

(52) U.S. Cl.
CPC .. *H01L 27/11524* (2013.01); *H01L 27/11568* (2013.01); *H01L 29/40114* (2019.08); *H01L 29/40117* (2019.08); *H01L 29/42324* (2013.01); *H01L 29/42348* (2013.01); *H01L 29/518* (2013.01); *H01L 29/6653* (2013.01); *H01L 29/66825* (2013.01); *H01L 29/66833* (2013.01); *H01L 29/792* (2013.01)

(58) Field of Classification Search
CPC .......... H01L 27/11568; H01L 27/1157; H01L 29/40114; H01L 29/40117; H01L 29/42324; H01L 29/42344; H01L 29/42348; H01L 29/518; H01L 29/6653; H01L 29/66825; H01L 29/66833; H01L 29/792
USPC ................................ 257/316, 317, 324, 326
See application file for complete search history.

(56) References Cited

U.S. PATENT DOCUMENTS

| | | | |
|---|---|---|---|
| 8,530,950 B1 | 9/2013 | Kang et al. | |
| 9,450,057 B2 | 9/2016 | Wu et al. | |
| 2003/0198086 A1 | 10/2003 | Shukuri | |
| 2008/0029808 A1 | 2/2008 | Jeon et al. | |
| 2009/0050956 A1 | 2/2009 | Ishimaru et al. | |
| 2009/0315100 A1* | 12/2009 | Jeong | H01L 29/4234 257/324 |
| 2010/0006914 A1 | 1/2010 | Nakagawa | |
| 2010/0029052 A1* | 2/2010 | Kang | H01L 29/792 438/261 |
| 2010/0193857 A1* | 8/2010 | Nakagawa | H01L 29/42344 257/324 |
| 2010/0255670 A1* | 10/2010 | Onda | H01L 27/11568 438/591 |
| 2015/0179816 A1* | 6/2015 | Williams | H01L 29/42344 257/326 |
| 2018/0366551 A1* | 12/2018 | Fang | H01L 21/0217 |

OTHER PUBLICATIONS

Non Final Office Action dated Nov. 23, 2015 U.S. Appl. No. 14/276,631.
Notice of Allowance dated May 20, 2016 U.S. Appl. No. 14/276,631.
Non-Final Office Action dated Oct. 8, 2015 for U.S. Appl. No. 14/182,952.
Final Office Action dated Mar. 24, 2016 for U.S. Appl. No. 14/182,952.
Notice of Allowance dated Jul. 1, 2016 for U.S. Appl. No. 14/182,952.
Non-Final Office Action dated Oct. 5, 2017 for U.S. Appl. No. 15/332,115.
Final Office Action dated Apr. 20, 2018 for U.S. Appl. No. 15/332,115.
Notice of Allowance dated Jul. 18, 2018 for U.S. Appl. No. 15/332,115.
Non-Final Office Action dated Jun. 24, 2019 for U.S. Appl. No. 16/166,603.
Notice of Allowance dated Nov. 7, 2019 for U.S. Appl. No. 16/166,603.

* cited by examiner

SPLIT GATE MEMORY DEVICE AND METHOD OF FABRICATING THE SAME

REFERENCE TO RELATED APPLICATIONS

This application is a Continuation of U.S. application Ser. No. 16/166,603, filed on Oct. 22, 2018, which is a Divisional of U.S. application Ser. No. 15/332,115, filed on Oct. 24, 2016 (now U.S. Pat. No. 10,147,794, issued on Dec. 4, 2018), which is a Continuation of U.S. application Ser. No. 14/182,952, filed on Feb. 18, 2014 (now U.S. Pat. No. 9,484,351, issued on Nov. 1, 2016). The contents of the above-referenced patent applications are hereby incorporated by reference in their entirety.

BACKGROUND

Flash memory is an electronic non-volatile computer storage medium that can be electrically erased and reprogrammed. Flash cells are used in a wide variety of commercial and military electronic devices and equipment. In flash memory cells, over erase associated with stacked gate structures is eliminated by the use of a split gate structure.

DETAILED DESCRIPTION

Figure 1:
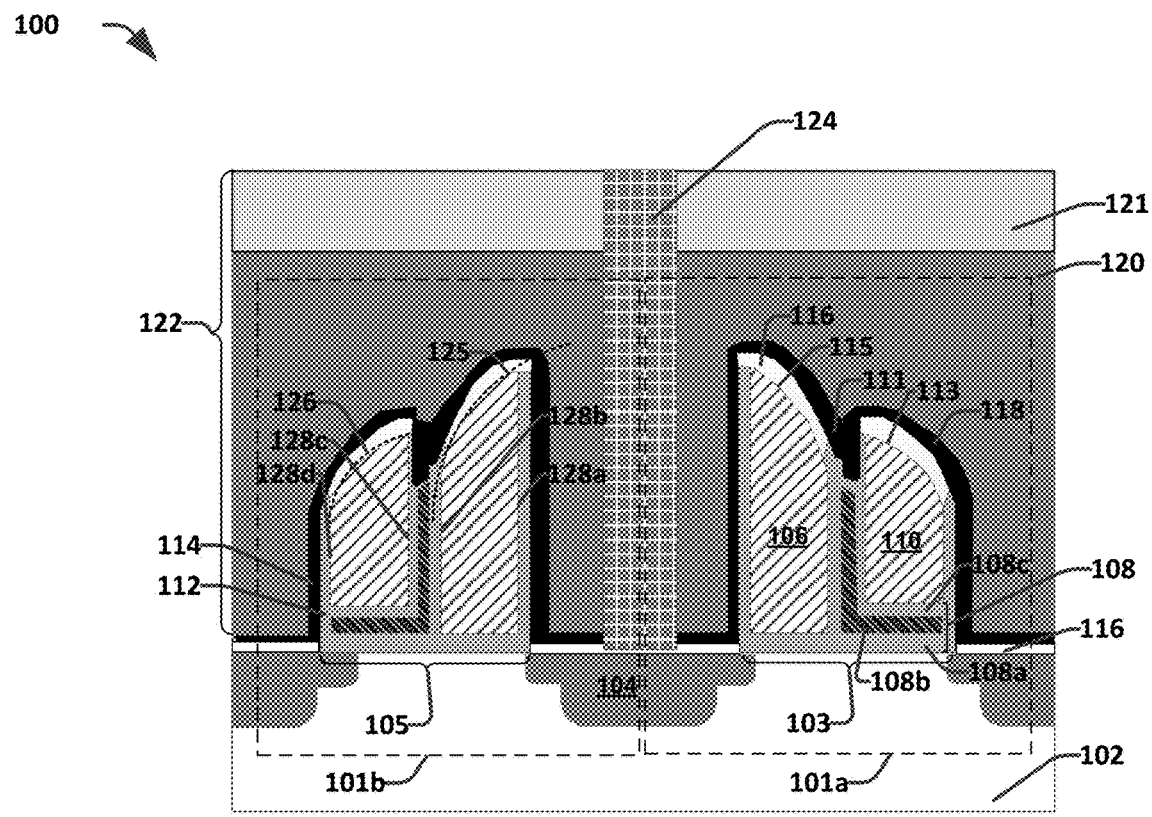
FIG. 1 shows a cross-sectional view of a pair of adjacent memory cells according to some embodiments of the present disclosure.
Figure 1:
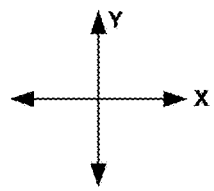

The description herein is made with reference to the drawings, wherein like reference numerals are generally utilized to refer to like elements throughout, and wherein the various structures are not necessarily drawn to scale. In the following description, for purposes of explanation, numerous specific details are set forth in order to facilitate understanding. It may be evident, however, to one of ordinary skill in the art, that one or more aspects described herein may be practiced with a lesser degree of these specific details. In other instances, known structures and devices are shown in block diagram form to facilitate understanding.

Split gate memory cells have promising advantages over stacked gate memory cells such as low power consumption, high injection efficiency, less susceptibility to short channel effects, and over erase immunity. The built in select gate transistor in a split gate memory cell can effectively get rid of the on-chip erase procedures that were used in traditional stacked gate cells to resolve over erase problems. Traditional fabrication methods of the split gate memory cells involve many processing steps which include patterned masking and dry etching steps. The large number of processing steps results in substantial fabrication costs.

Accordingly, the present disclosure relates to a method for creating split gate flash memory cells with fewer process steps than traditional baseline processes. Apart from reducing the effective processing cost, this method provides symmetric word gate pairs that are formed around a sacrificial spacer. The sacrificial spacer material used in the sacrificial spacer is chosen such that it is compatible with the underlying silicon substrate as well as the processing steps that follow. The method focuses on forming self-aligned gate structures (gate material deposited over a sacrificial spacer followed by wet etching with no mask involved) and it leads to an easily distinguishable select gate (SG) feature, where the SG structure will have a non-planar top surface unlike traditional SG structures.

Some traditional split-gate memory processing techniques include a source side protected masked lithography step for removing word-line (WL) poly from a drain side of the memory cell. This is done in order to isolate neighboring memory cells as well as to reduce contact resistance. The present disclosure does not involve such a step and hence causes less damage to the silicon substrate. Here, after formation of the gate structures, the sacrificial spacer material is easily removed, which separates neighboring memory cell pairs as well as creates an open space for contact formation. Thus, the present disclosure presents a cost effective and simple method for fabricating split gate memory cells with self-aligned gate structures.

FIG. 1 illustrates a cross-sectional view 100 of a pair of adjacent memory cells, according to some embodiments of the present disclosure, namely a first memory cell 101a and a second memory cell 101b. These memory cells 101a and 101b have a first shared common source/drain (S/D) region 104 in a semiconductor body 102 and a first contact 124 that connects to the first shared S/D region 104. In some embodiments, the semiconductor body 102 comprises silicon (Si) and the first contact 124 comprises Ti/TiN (titanium/titanium nitride) and W (tungsten). The pair of adjacent memory cells comprises a first gate structure 103 and a second gate structure 105 that are mirror images of one another. Hence, it is duly specified that all the features illustrated for the first gate structure 103 are applicable to the second gate structure 105. The first gate structure 103 comprises a first select gate (SG) 106 and a first memory gate (MG) 110. In some embodiments, the SG 106 and the MG 110 comprise poly silicon.

The first MG 110 and first SG 106 have non-planar top surfaces, 113 and 115 respectively. Relative to an upper surface of the semiconductor body, each of these non-planar top surfaces 113 and 115 continuously and/or monotonically decrease in height, as one moves along the X-axis, from example, in the direction away from the first contact 124.

In the illustrated example, these non-planar top surfaces 113 and 115 are rounded surfaces with different curvatures. The different curvatures of these surfaces 113, 115 are due to the process steps used to form them. In the illustrated embodiment, the non-planar SG top surface 115 has a first curvature 125, and the non-planar MG top surface 113 has a second curvature 126 that is non-continuous with the first curvature 125. In some embodiments, the curvatures 125 and 126 can be approximated by different radii, wherein the radius of curvature 125 is greater than the radius of curvature 126. Although these curvatures can be approximately by different radii, it will be appreciated that the curvatures need not be truly circular, but can be elliptical, parabolic, hyperbolic, and/or have other curvatures.

In some embodiments, each SG of the memory cells 101a and 101b comprises a first select gate side wall 128a and second select gate side wall 128b, wherein a height of the first select gate side wall 128a is greater than a height of the second select gate side wall 128b. Similarly each MG 110 of the memory cells 101a and 101b comprises a first memory gate side wall 128c and a second memory gate side wall 128d. The first memory gate side wall 128c, which neighbors the second select gate sidewall 128b, has a height greater than a height of the second select gate side wall 128b. In some embodiments, the height of the first memory gate side wall 128c is also greater than a height of the second memory gate sidewall 128d. Formation of the symmetric self-aligned gates with non-planar top surfaces reduce processing steps (as it involves no mask patterning and CMP processes) thereby reducing the manufacturing cost. Further, they provide a distinguishable select gate SG feature that is different from traditional SG structures.

An inter-gate dielectric layer 108 resides in between the first SG 106 and the first MG 110. The inter gate dielectric layer 108 further extends under the first MG 110. In some embodiments, the inter gate dielectric layer 108 comprises an oxide layer 108a, a nitride layer 108b, and a second oxide layer 108c, which are referred to collectively as an ONO (oxide/oxynitride/oxide) structure.

A first dielectric 111 is disposed above the inter-gate dielectric layer 108 and is arranged between the neighboring sidewalls of the first MG 110 and the first SG 106 to provide isolation between the first MG 110 and the first SG 106. In some embodiments, the first dielectric layer 111 comprises SiN (silicon nitride). An oxide 112 is deposited along the side walls of the first MG 110 and the first SG 106. Salicide 116 is deposited over the top surfaces of the SG 106 and the MG 110 as well as on either side of the gate structures 103 and 105 above the semiconductor body 102. A spacer layer 114 is arranged above both the first memory gate 110 and the first SG 106 and has a profile that follows the non-planar top surfaces of the first MG 110 and first SG 106. In some embodiments, the spacer layer 114 comprises SiN or oxide. A contact etch stop layer (CESL) 118 is deposited along the oxide 112 and above the silicide 116. In some embodiments, the CESL layer 118 comprises SiN. A dielectric layer 122 is deposited entirely over the semiconductor body for filling the gaps between the gate structures. The dielectric layer 122 comprises a BPTEOS (borophosphosilicatetetraethylorthosilicate) layer 120 for gap filling and a TEOS (tetetraethylorthosilicate) layer 121 above the BPTEOS layer 120 for preventing water absorption.

Each memory cell 101a, 101b can be thought of as two transistors in series. One is the memory gate transistor (e.g., corresponding to MG 110), and the other is the select gate transistor (e.g. corresponding to SG 106) which is a simple enhancement transistor controlled by the word line. Programming is performed by means of source-side channel hot-electron injection. Poly-to-poly Fowler-Nordheim (FN) electron tunneling is employed for erasing. To change the cell value to a "0", a negative electrical potential is applied to both the gates, such that the electrons stored in the storage node (ONO layer) are drained to the source side of the memory cell. The electrons in the cells of a chip can be returned to normal "1" by the application of a strong positive electric field.

Figure 2:
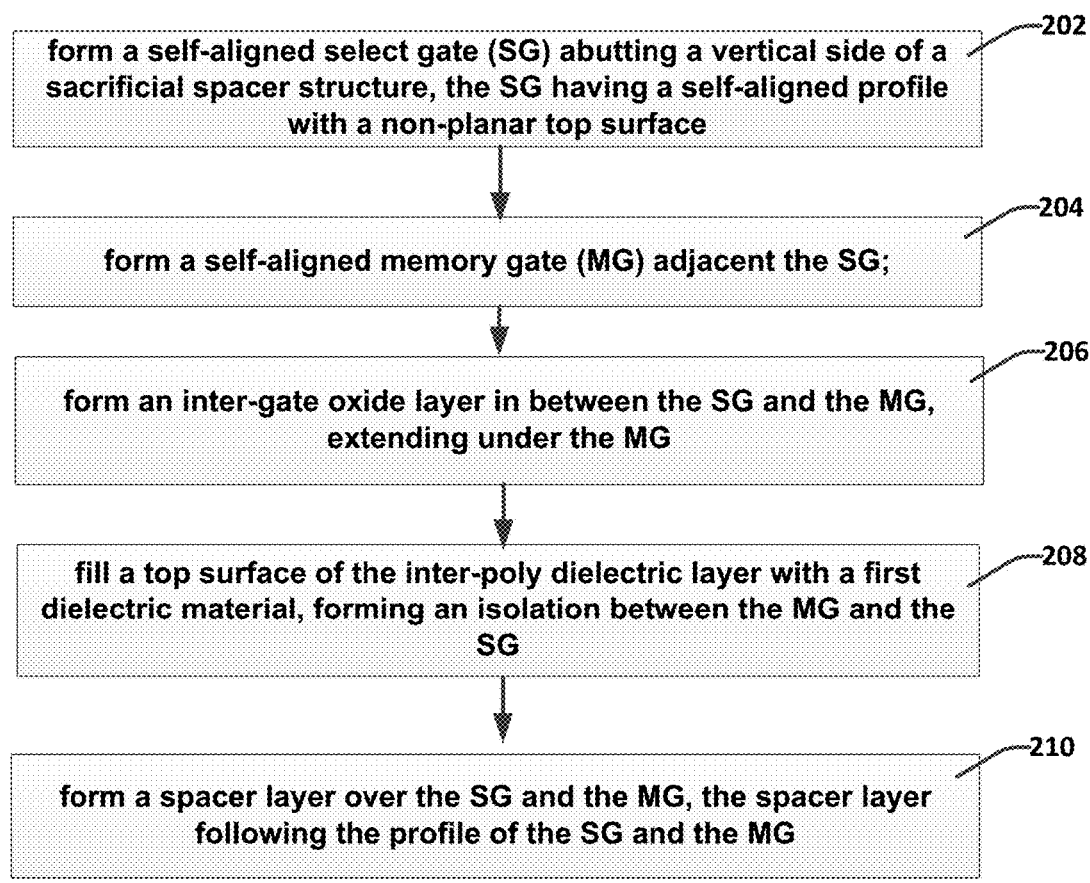
FIG. 2 shows a flow diagram of a method according to some embodiments of the present disclosure.

FIG. 2 shows a flow diagram of a method 200 according to some embodiments of the present disclosure. While disclosed method 200 (and other methods described herein) is illustrated and described below as a series of acts or events, it will be appreciated that the illustrated ordering of such acts or events are not to be interpreted in a limiting sense. For example, some acts may occur in different orders and/or concurrently with other acts or events apart from those illustrated and/or described herein. In addition, not all illustrated acts may be required to implement one or more aspects or embodiments of the description herein. Further, one or more of the acts depicted herein may be carried out in one or more separate acts and/or phases.

At 202 a self-aligned SG is formed abutting a first sidewall of a sacrificial spacer. A symmetric SG is formed on a second opposite sidewall of the same sacrificial spacer. The self-alignment creates a non-planar top surface, which leans towards opposite direction on both the select gates that are formed on either side of the sacrificial spacer.

At 204, a self-aligned memory gate (MG) is formed adjacent the SG.

At 206, an inter-gate dielectric layer is formed in between the SG and the MG, the inter-gate dielectric layer extending under the MG and leaving a recess between upper regions of the MG and SG.

At 208, the recess left by the inter-gate dielectric layer is filled with a first dielectric material to provide isolation between the MG and the SG.

At 210, a spacer layer is formed over the SG and the MG, the spacer layer following the profile of the SG and the MG and having a non-planar top surface.

Figure 3:
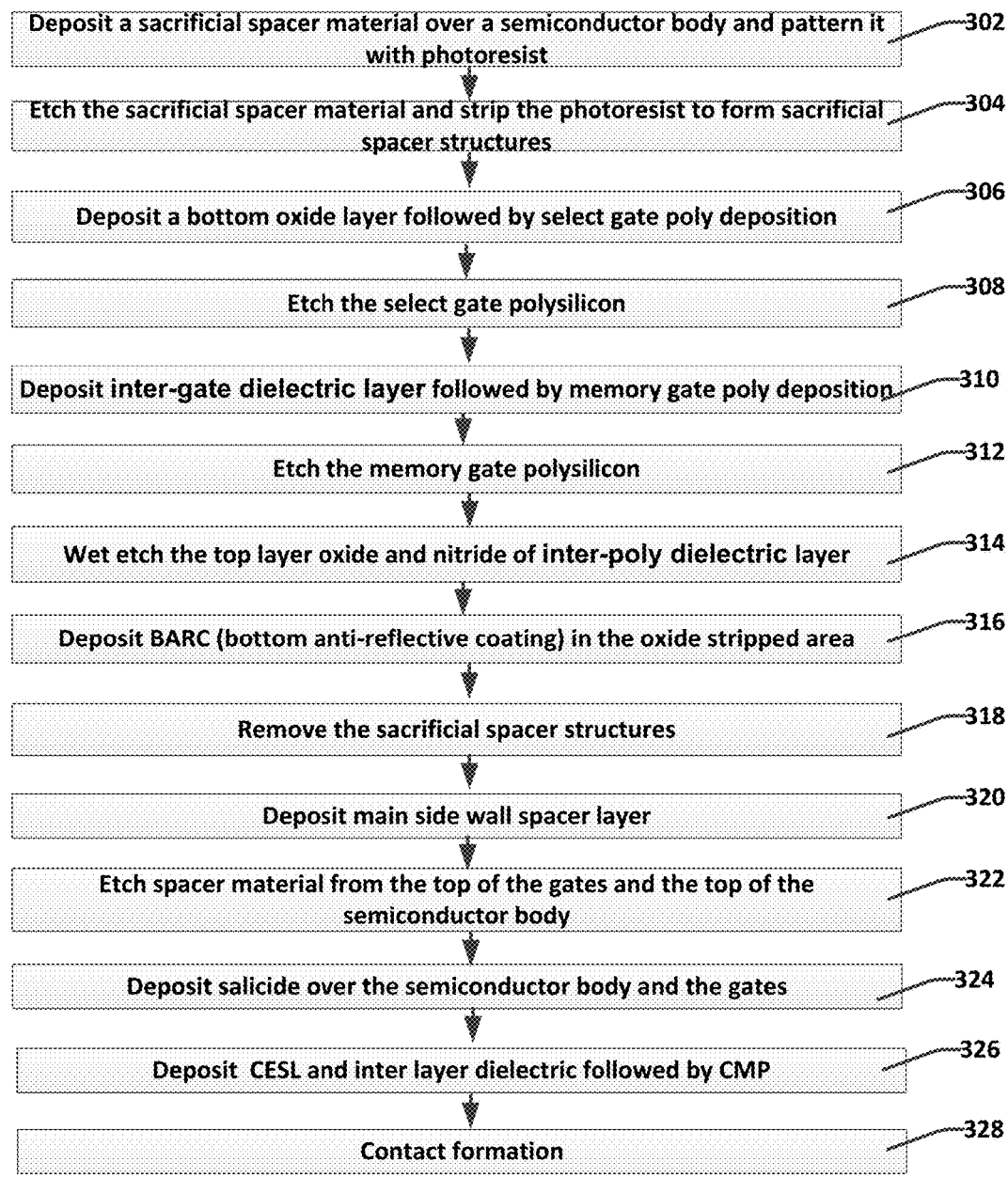
FIG. 3 shows a flow diagram of a method for forming split gate memory device according to some embodiments of the present disclosure.

FIG. 3 shows a flow diagram of a method 300 for forming a split gate memory device according to some embodiments of the present disclosure.

At 302, a sacrificial spacer material is deposited over a semiconductor substrate and patterned with the help of photoresist. In some embodiments, the sacrificial spacer material comprises SiN, SiC and/or SiO2.

At 304, the sacrificial spacer material is etched and the photoresist stripped to create sacrificial spacers over the semiconductor body. In some embodiments, symmetric sacrificial spacers are formed over the semiconductor body. In some embodiments the sacrificial spacer material may be lithographically defined and removed by either plasma/RIE etch or a selective wet etch.

At 306, a bottom oxide layer is deposited entirely over the semiconductor body followed by SG material deposition. In some embodiments, the SG comprises poly silicon.

At 308, the SG poly silicon is etched to form SG structures on either side of the sacrificial spacers. The etching stops at the bottom oxide layer.

At 310, an inter-gate dielectric layer is deposited followed by deposition of MG material. In some embodiments, the inter-gate dielectric layer is the charge storage node and it comprises ONO.

At 312, the MG material/poly silicon is etched to form MG structures on either side of the sacrificial spacer outside the inter-gate dielectric layer.

At 314, the first two layers of the inter-gate dielectric layer or the ONO layer are wet etched. In some embodiments, the ON (oxy nitride) layer is removed by wet etching.

At 316, a bottom anti-reflective coating (BARC) is deposited entirely over the ON (oxy nitride) stripped areas.

At 318, the sacrificial spacers are removed or etched off. The oxide above the sacrificial spacer and the top of the SGs is also removed. In some embodiments, the sacrificial spacers are removed using a wet etchant combination of HF and H3PO4 (hydrogen fluoride and phosphoric acid).

At 320, a main side wall spacer layer is deposited all over the semiconductor body and over the gate structures.

At 322, the spacer layer is etched off from the top of the semiconductor body and from the top of the gate structures, but retained on the gate side walls and over the ONO layer in between the SG and the MG, providing isolation between them.

At 324, a salicide is deposited over the top of the top of the gate structures and the semiconductor body after removing the oxide from their surfaces.

At 326, a contact etch stop layer (CESL) and interlayer dielectric is deposited entirely over the semiconductor body covering all the gaps and they are planarized using a chemical mechanical polishing (CMP) process. In some embodiments, the CESL comprises SiN and the interlayer dielectric layer comprises an oxide.

At 328, another top layer dielectric is deposited over the inter layer dielectric to prevent H₂O absorption and metal contacts are formed extending in to the source/drain (S/D) regions. In some embodiments, the inter-layer dielectric used for filling the gap comprises BPTEOS and the top layer dielectric comprises TEOS. In some embodiments, the metal contacts comprises Ti/TiN as a buffer layer which is filled with W.

FIGS. 4-17 show cross-sectional views of a method 300 of forming split gate memory cells according to some embodiments of the present disclosure.

Figure 4:
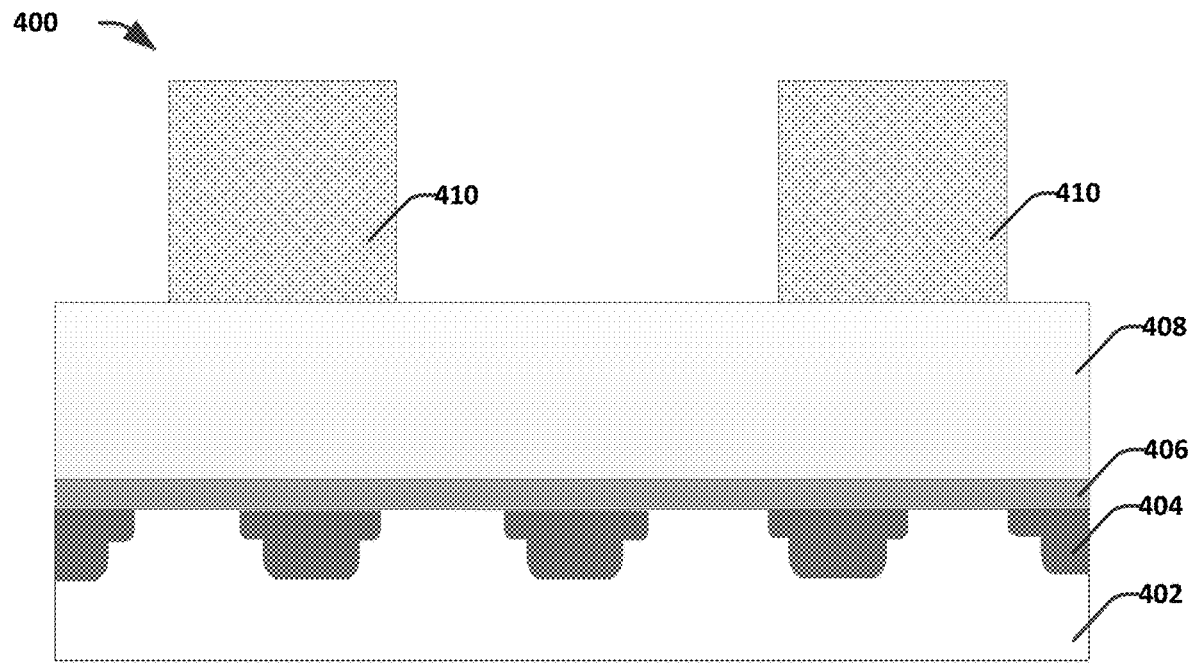
FIGS. 4-17 show cross-sectional views at various stages of forming a split gate memory cell according to some embodiments of the present disclosure.

FIG. 4 illustrates a cross-sectional view 400 at one of the stages of forming split gate memory cells according to some embodiments of the present disclosure, with patterned photo resist 410 over a semiconductor body 402. The semiconductor body 402 has S/D regions 404 diffused or formed within. An oxide layer 406 resides on top of the semiconductor body for protecting the semiconductor body from future etching steps. Over the oxide layer 406 sacrificial spacer material 408 is deposited which is subsequently patterned and etched. The photoresist 410 on top of the sacrificial spacer material 408 used is to pattern the sacrificial spacer material to form sacrificial spacers.

Figure 5:
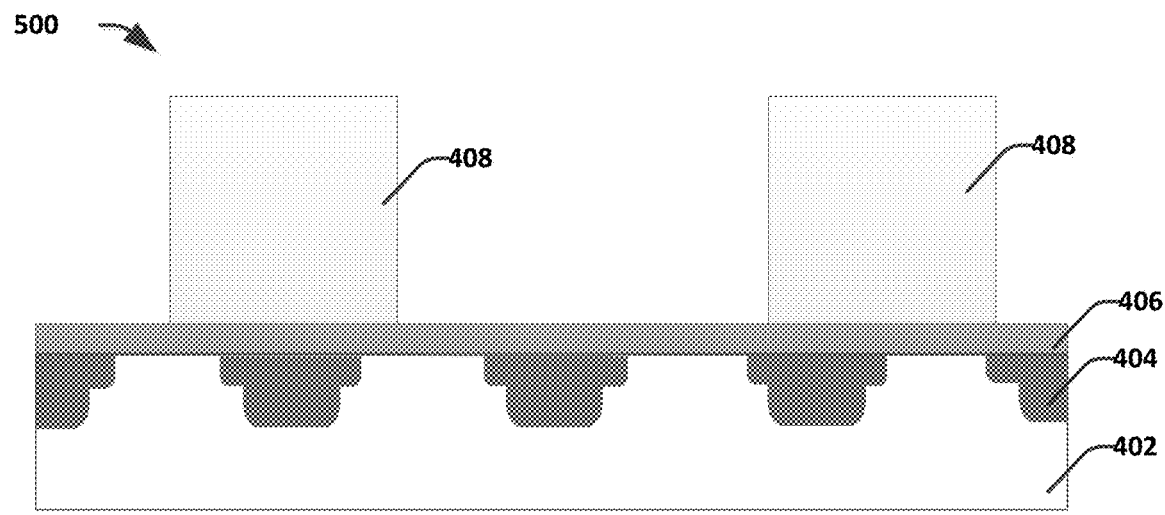

FIG. 5 illustrates a cross-sectional view 500 of another stage of forming split gate memory cells according to some embodiments of the present disclosure, after the sacrificial spacer material 408 is etched and the photo resist is stripped off.

Figure 6:
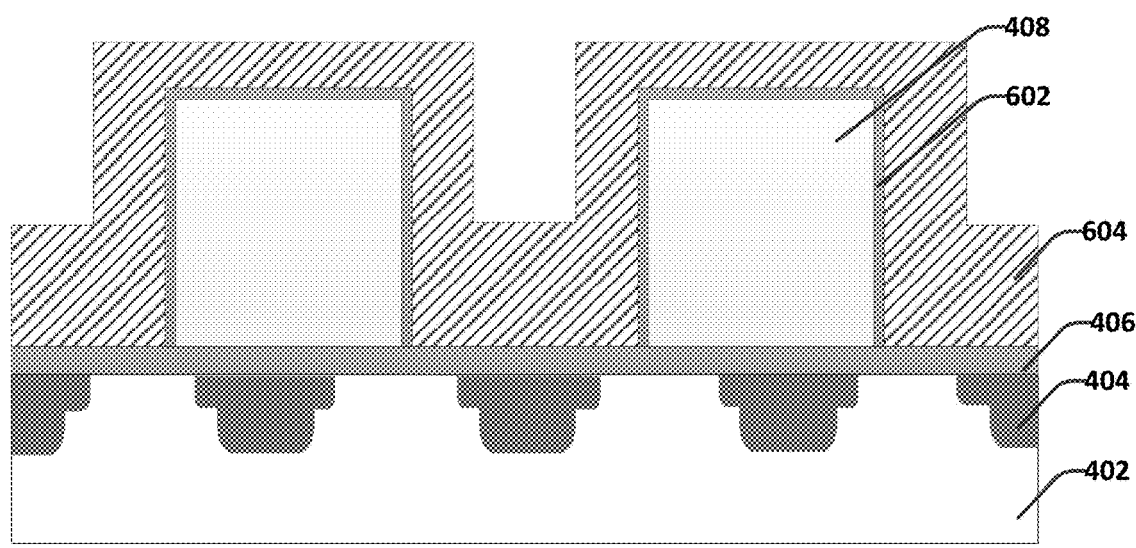

FIG. 6 illustrates a cross-sectional view 600 of another stage of forming split gate memory cells according to some embodiments of the present disclosure, after depositing or forming an oxide 602 over the sacrificial spacers 408 followed by deposition of the SG poly silicon 604.

Figure 7:
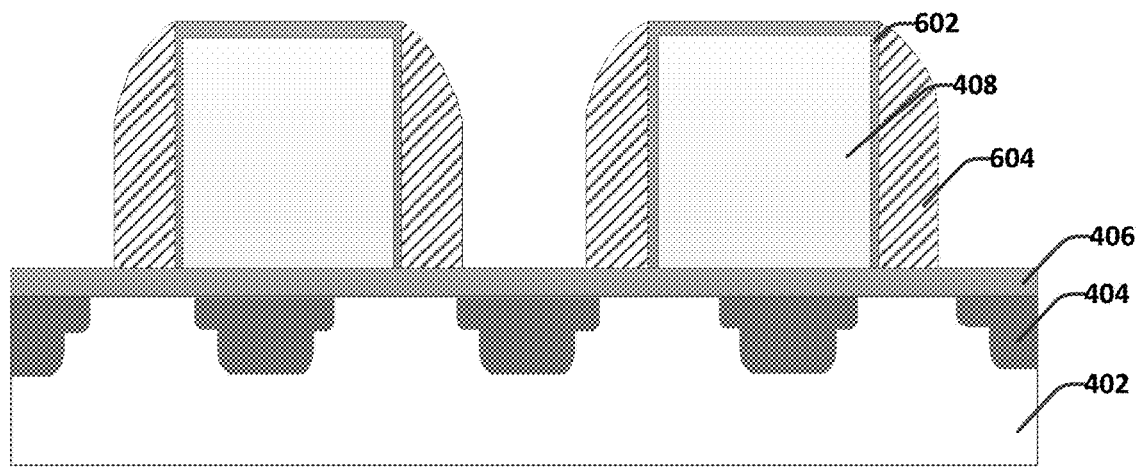

FIG. 7 illustrates a cross-sectional view 700 of another stage of forming split gate memory cells according to some embodiments of the present disclosure, wherein the SG poly silicon 604 is etched to form SG pairs on either side of the sacrificial spacer 408. In some embodiments, the SG poly silicon is etched off using wet etching without using a mask step.

Figure 8:
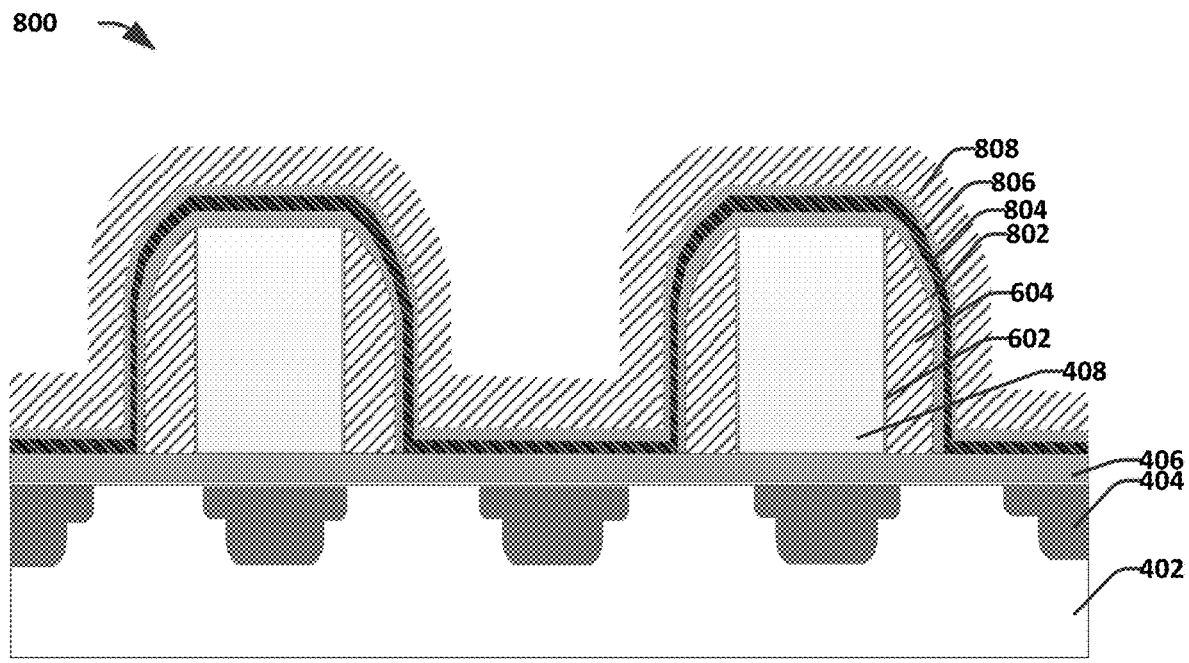

FIG. 8 illustrates a cross-sectional view 800 of another stage of forming split gate memory cells according to some embodiments of the present disclosure, after depositing an ONO (oxide-oxynitride-oxide) layer and the MG poly silicon 808 entirely over the oxide 406, sacrificial spacers 408 and the SGs 604. The first oxide layer of the ONO layer is represented by 802, the nitride layer is represented by 804 and the top oxide layer is represented by 806.

Figure 9:
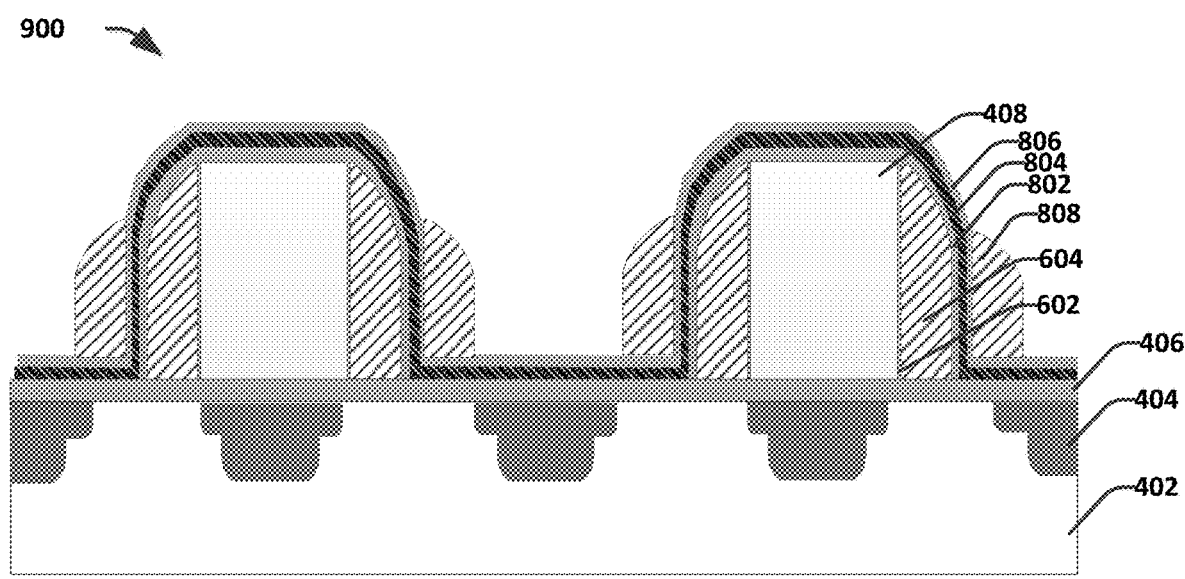

FIG. 9 illustrates a cross-sectional view 900 of another stage of forming split gate memory cells according to some embodiments of the present disclosure, after etching the MG poly silicon to form MGs 808 on either side of the sacrificial spacers 408. In some embodiments, the MG poly silicon is etched off using wet etching which stops at the top oxide layer 806, without using a mask step.

Figure 10:
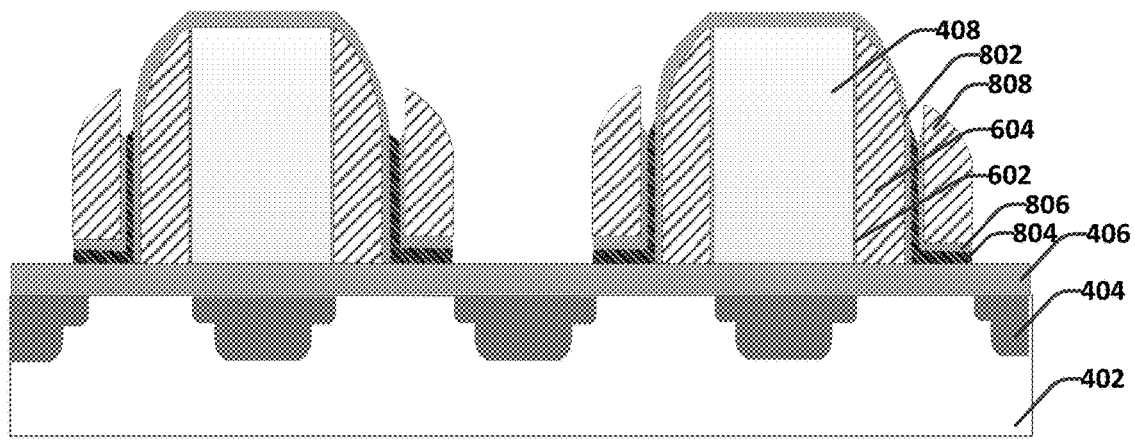

FIG. 10 illustrates a cross-sectional view 1000 of another stage of forming split gate memory cells according to some embodiments of the present disclosure, after etching the top oxide layer 806 and the nitride layer 804 of the ONO layer at specified location. In some embodiment wet etching, dry etching, plasma etching or reactive ion etching (RIE) is performed.

Figure 11:
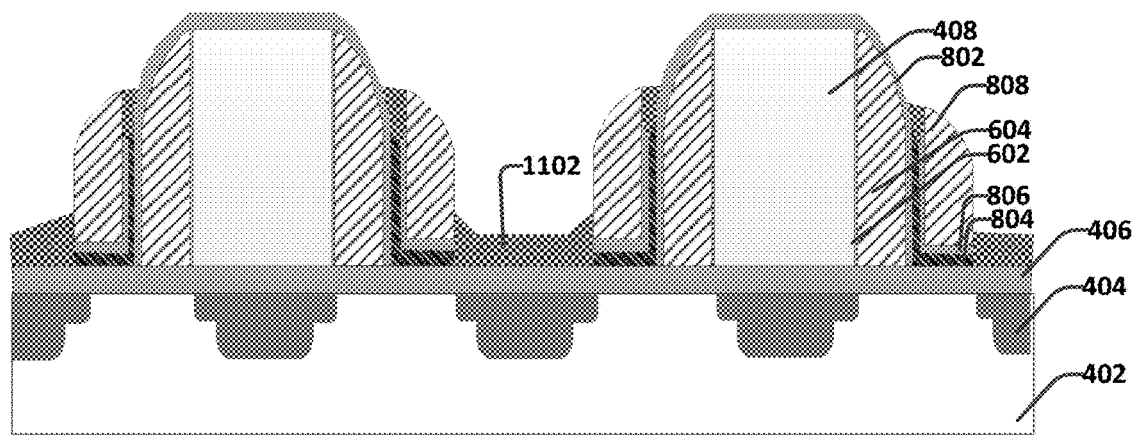

FIG. 11 illustrates a cross-sectional view 1100 of another stage of forming split gate memory cells according to some embodiments of the present disclosure, wherein a BARC layer 1102 is deposited at the oxide and nitride stripped areas. This layer protects the underlying layers in future etching steps.

Figure 12:
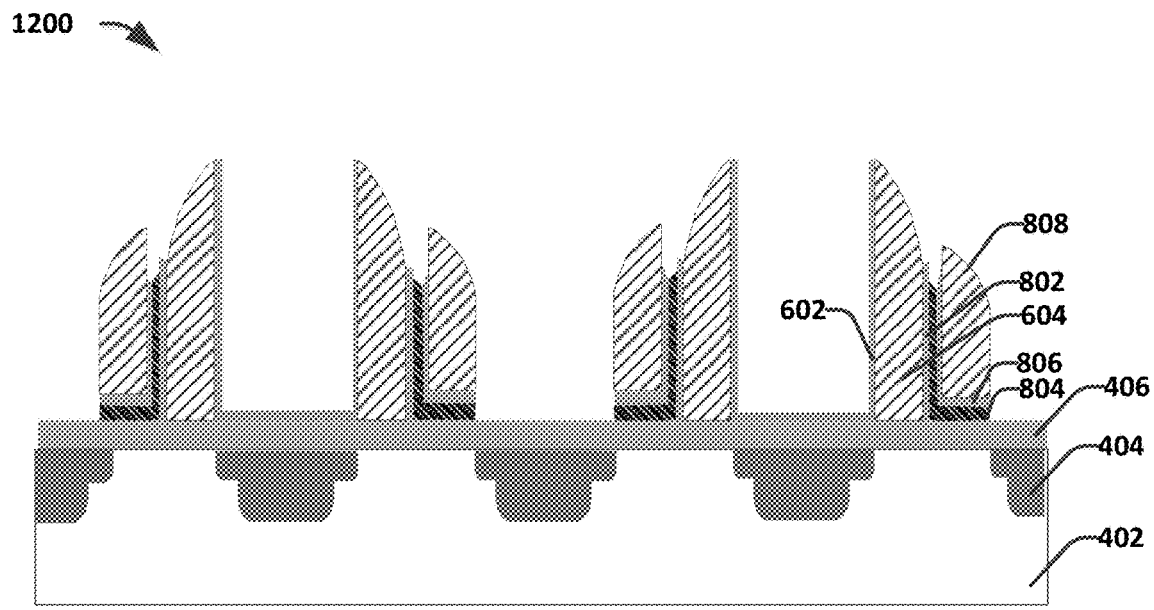

FIG. 12 illustrates a cross-sectional view 1200 of another stage of forming split gate memory cells according to some embodiments of the present disclosure, after removing the sacrificial spacers 408 and the oxide residing over the top surfaces of the sacrificial spacers and the gate structures. In some embodiments, the oxide and sacrificial spacers are removed using a wet etchant combination of HF+H3PO4.

Figure 13:
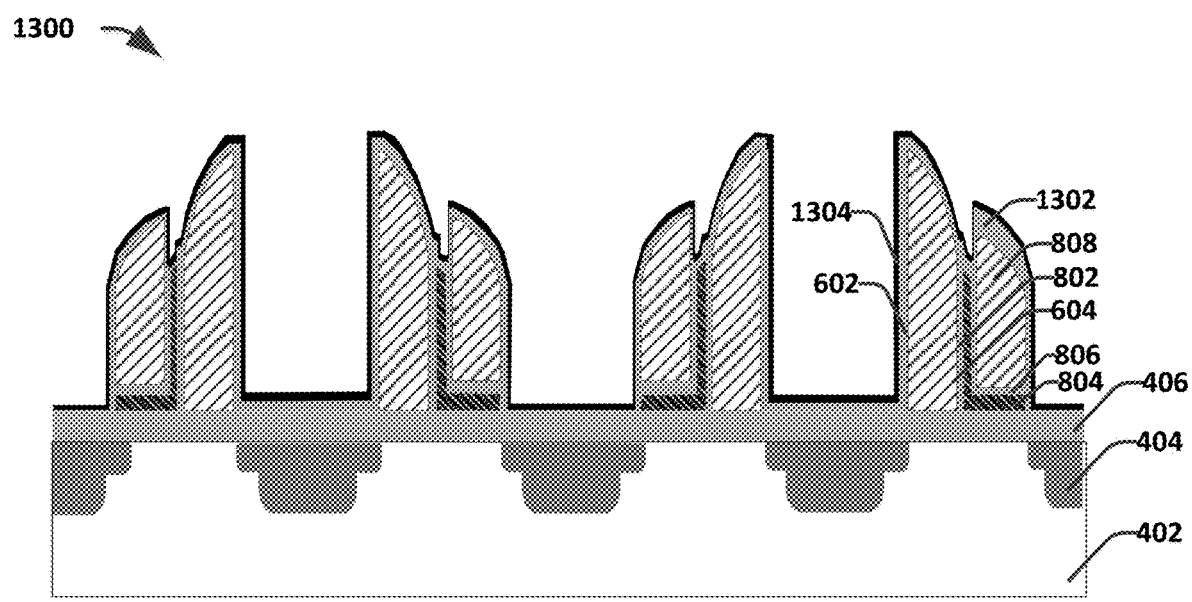

FIG. 13 illustrates a cross-sectional view 1300 of another stage of forming split gate memory cells according to some embodiments of the present disclosure, after depositing a main side wall spacer layer 1304 over the gate structures as well as over the oxide layer 404. Before depositing the spacer layer 1304, an oxide layer 1302 is deposited on the top surfaces of the gate structures. In some embodiments, the spacer layer comprises oxide+SiN.

Figure 14:
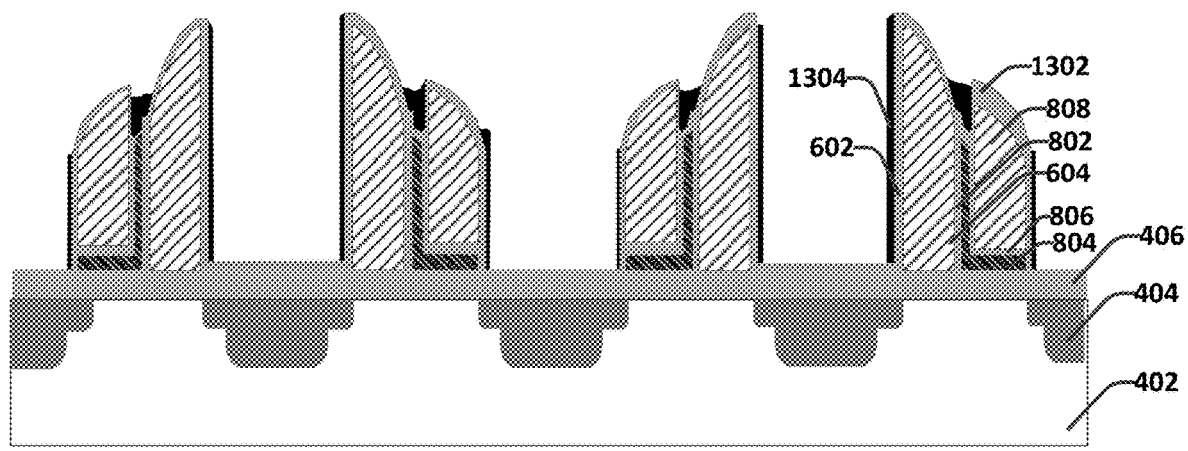

FIG. 14 illustrates a cross-sectional image 1400 of another stage of forming split gate memory cells according to some embodiments of the present disclosure, wherein the space layer 1304 is etched off from the top surface of the gate structures as well as from the oxide layer 406. The spacer layer 1304 is retained on the side walls of the MGs and the SGs as well as over the ONO layer in between the two adjacent SG-MG pairs.

Figure 15:
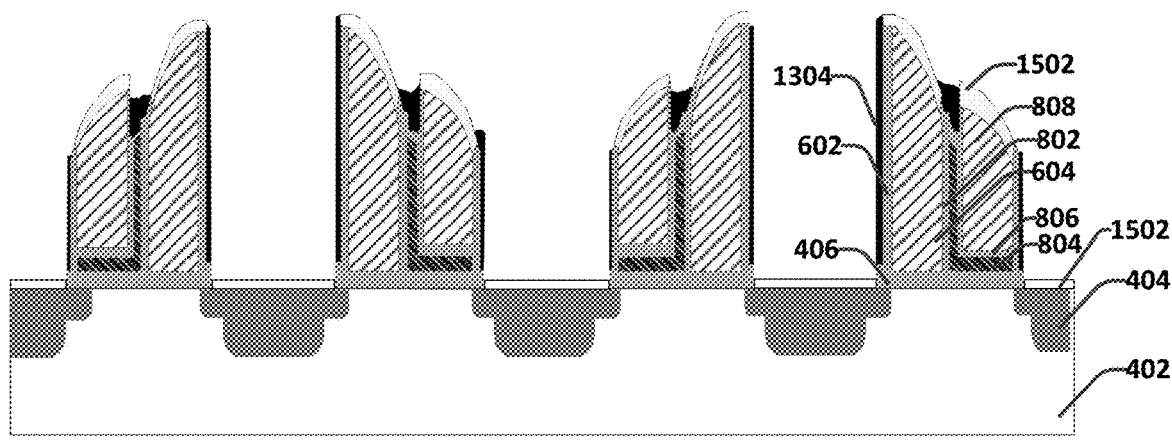

FIG. 15 illustrates a cross-sectional view 1500 of another stage of forming split gate memory cells according to some embodiments of the present disclosure, after removing a layer of oxide and depositing a salicide layer 1502. The oxide layer 406 is removed from the top of the semiconductor body 402 from areas between the gate structures and the oxide 1302 is removed from the non-planar top surfaces of the gate structures. Salicide layer 1502 is deposited in the above mentioned oxide stripped areas.

Figure 16:
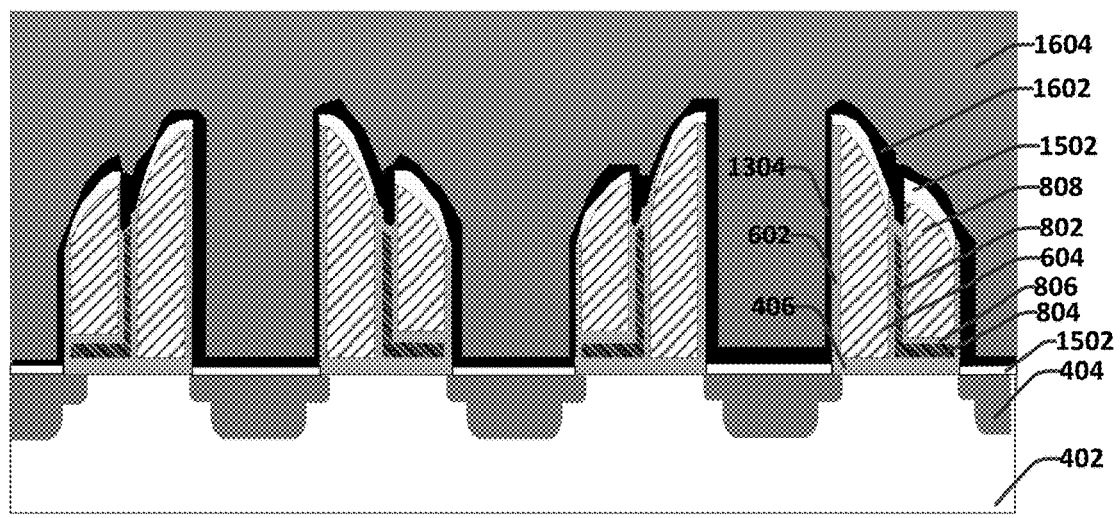

FIG. 16 illustrates a cross-sectional view 1600 of another stage of forming split gate memory cells according to some embodiments of the present disclosure, after depositing a contact etch stop layer (CESL) 1602 and interlayer dielectric 1604 entirely over the semiconductor body covering all the gaps. The inter-dielectric 1604 is planarized using a chemical mechanical polishing (CMP) process. In some embodiments, the CESL 1602 comprises SiN and the interlayer dielectric layer 1604 comprises BPTEOS.

Figure 17:
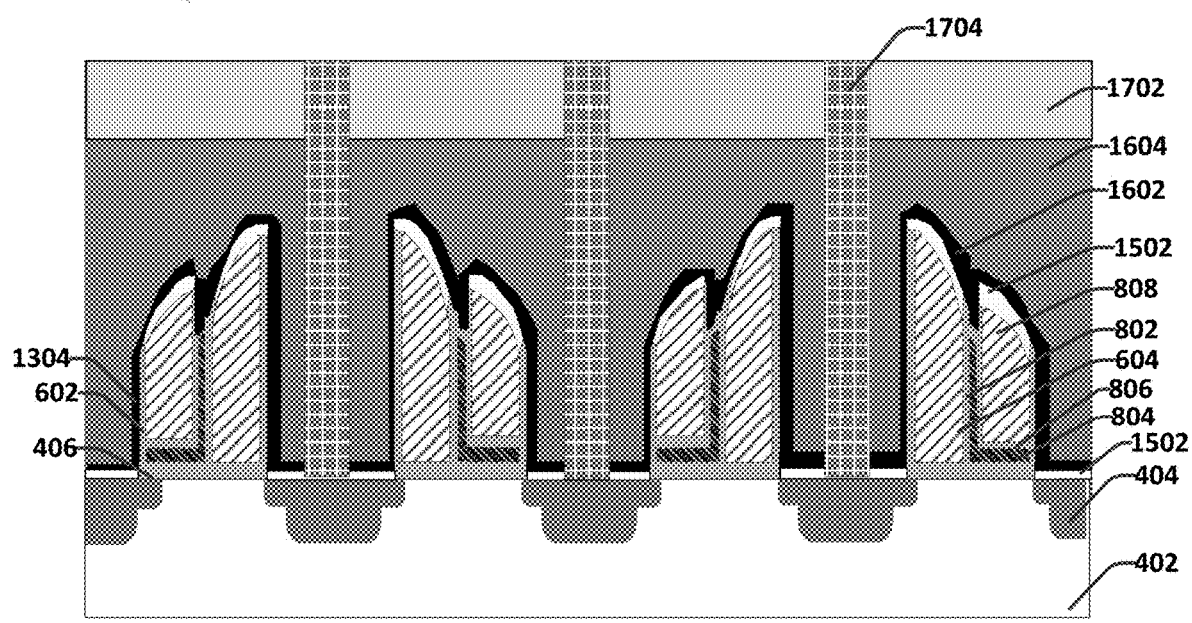

FIG. 17 illustrates a cross-sectional view 1700 of another stage of forming split gate memory cells according to some embodiments of the present disclosure, after depositing another top layer dielectric 1702 entirely over the inter layer dielectric 1604 to prevent H2O absorption, and forming metal contacts 1704 that extend downward to the source/drain (S/D) regions 404. In some embodiments, the top layer dielectric 1702 comprises TEOS and the metal contacts 1704 comprises Ti/TiN as a buffer layer which is filled with W.

It will be appreciated that while reference is made throughout this document to exemplary structures in discussing aspects of methodologies described herein that those methodologies are not to be limited by the corresponding structures presented. Rather, the methodologies (and structures) are to be considered independent of one another and able to stand alone and be practiced without regard to any of the particular aspects depicted in the Figs. Additionally, layers described herein, can be formed in any suitable manner, such as with spin on, sputtering, growth and/or deposition techniques, etc.

Also, equivalent alterations and/or modifications may occur to those skilled in the art based upon a reading and/or understanding of the specification and annexed drawings. The disclosure herein includes all such modifications and alterations and is generally not intended to be limited thereby. For example, although the figures provided herein, are illustrated and described to have a particular doping type, it will be appreciated that alternative doping types may be utilized as will be appreciated by one of ordinary skill in the art.

In the description, relative terms such as "lower," "upper," "horizontal," "vertical," "above," "below," "up," "down," "top" and "bottom" as well as derivatives thereof (e.g., "horizontally," "downwardly," "upwardly," etc.) should be construed to refer to the orientation as then described or as shown in the drawing under discussion. These relative terms are for convenience of description and do not require that the apparatus be constructed or operated in a particular orientation.

In addition, while a particular feature or aspect may have been disclosed with respect to only one of several implementations, such feature or aspect may be combined with one or more other features and/or aspects of other implementations as may be desired. Furthermore, to the extent that the terms "includes", "having", "has", "with", and/or variants thereof are used herein such terms are intended to be inclusive in meaning—like "comprising." Also, "exemplary" is merely meant to mean an example, rather than the best. It is also to be appreciated that features, layers and/or elements depicted herein are illustrated with particular dimensions and/or orientations relative to one another for purposes of simplicity and ease of understanding, and that the actual dimensions and/or orientations may differ substantially from that illustrated herein.

The present disclosure relates to a method for creating split gate flash memory cells with self-aligned select gate structures and less number of processing steps than traditional baseline processes. The method provides symmetric word gate/select gate pairs that are formed around a sacrificial spacer. The sacrificial spacer material used in the sacrificial spacer is chosen such that it is compatible with the underlying silicon substrate as well as the processing steps that follow. The method results in an easily distinguishable select gate (SG) feature, i.e., the SG structure will have a non-planar top surface that continuously and/or monotonically decrease in height along a first direction, relative to an upper surface of the semiconductor body surface unlike traditional select gate structures. The spacer layer that covers the select gate also follows the shape of the SG top surface. A dielectric disposed above the inter-gate dielectric layer and arranged between the neighboring sidewalls of the each memory gate and select gate provides isolation between them.

In some embodiments, the present disclosure relates to a split gate memory device. The split gate memory device comprises a memory gate arranged over a substrate, and a select gate arranged over the substrate. An inter-gate dielectric layer is arranged between sidewalls of the memory gate and the select gate that face one another. The inter-gate dielectric layer extends under the memory gate. A first dielectric is disposed above the inter-gate dielectric layer and is arranged between the sidewalls of the memory gate and the select gate.

In another embodiment, the present disclosure relates to an integrated chip. The integrated chip comprises a first select gate and a second select gate arranged over an upper surface of a substrate. A shared source/drain region is arranged within the upper surface of the substrate between the first select gate and the second select gate. A first memory gate is arranged over the upper surface of the substrate at a location spaced apart from the shared source/drain region by the first select gate. The first select gate has a top surface that monotonically decreases in height relative to the upper surface of the substrate as a distance to the first memory gate decreases. An inter-gate dielectric layer is arranged between the first memory gate and the first select gate. The inter-gate dielectric layer extends under the first memory gate.

In yet another embodiment, the present disclosure relates to an integrated chip. The integrated chip comprises a first select gate and a second select gate arranged over a substrate. A source/drain region is arranged within the substrate between the first select gate and the second select gate. A first memory gate is arranged over the substrate at a location separated from the source/drain region by a first select gate. The first select gate has a top surface that increases in height relative to an upper surface of the substrate as a lateral distance to the source/drain region decreases. An inter-gate dielectric layer is arranged between the first memory gate and the first select gate. The inter-gate dielectric layer extends under the first memory gate.

What is claimed is:

1. A method of forming a memory cell, comprising:
   forming a sacrificial spacer over a substrate;
   forming a select gate along a side of the sacrificial spacer;
   forming an inter-gate dielectric over the select gate and the sacrificial spacer;
   forming a memory gate layer over the inter-gate dielectric and the sacrificial spacer, wherein the memory gate layer is laterally separated from the sacrificial spacer by the select gate; and
   etching the memory gate layer to define a memory gate having a topmost point below a top of the sacrificial spacer.

2. The method of claim 1, further comprising:
   etching the inter-gate dielectric after defining the memory gate;
   forming a masking layer along opposing outermost sidewalls of the memory gate after etching the inter-gate dielectric; and
   etching the inter-gate dielectric and the sacrificial spacer in areas exposed by the masking layer.

3. The method of claim 1, wherein etching the memory gate layer defines the memory gate along a first side of the sacrificial spacer and further defines a second memory gate along an opposing second side of the sacrificial spacer.

4. The method of claim 3, wherein the memory gate and the second memory gate are substantially symmetric about a vertical line bisecting the sacrificial spacer.

5. The method of claim 1, further comprising:
   performing a first etching process to remove a part of the inter-gate dielectric from directly over the sacrificial spacer; and
   performing a second etching process, after the first etching process is completed, to remove a remainder of the inter-gate dielectric from directly over the sacrificial spacer.

6. The method of claim 5, forming an anti-reflective coating over the inter-gate dielectric between the first etching process and the second etching process.

7. The method of claim 1, further comprising:
etching the inter-gate dielectric, after defining the memory gate, so as to recess the inter-gate dielectric to have an upper surface directly between the select gate and the memory gate, the upper surface vertically below the top of the sacrificial spacer.

8. The method of claim 1, further comprising:
forming a second sacrificial spacer over the substrate; and
forming a second select gate along a sidewall of the second sacrificial spacer, wherein the select gate and the second select gate are directly between the sacrificial spacer and the second sacrificial spacer.

9. A method of forming an integrated chip, comprising:
forming a spacer over a substrate;
forming a select gate along a first side of the spacer;
forming an inter-gate dielectric over the select gate and the spacer;
forming a memory gate layer over the inter-gate dielectric; and
performing a first etching process to etch the memory gate layer and to define a memory gate having a top below tops of the spacer and the select gate.

10. The method of claim 9, further comprising:
performing a second etching process to etch a part of the inter-gate dielectric that is below a bottom surface of the memory gate.

11. The method of claim 10, further comprising:
forming a source region within the substrate, wherein the inter-gate dielectric has a first outer sidewall facing the source region and a second outer sidewall facing away from the source region after the second etching process is finished, the second outer sidewall completely vertically below the bottom surface of the memory gate.

12. The method of claim 10, further comprising:
forming a dielectric over the select gate and the memory gate after performing the second etching process; and
performing a third etching process on the dielectric, wherein after the third etching process the dielectric remains along a sidewall of the select gate, along a sidewall of the memory gate, and directly over the inter-gate dielectric.

13. The method of claim 9, wherein the memory gate has a greater height along a first side of the memory gate facing the spacer than along an opposing side of the memory gate facing away from the spacer.

14. The method of claim 9, further comprising:
forming a second select gate along a second side of the spacer opposing the first side of the spacer; and
performing the first etching process to etch the memory gate layer and to define a second memory gate having a top below the top of the spacer, wherein the select gate is between the memory gate and the first side of the spacer and the second select gate is between the second memory gate and the second side of the spacer.

15. A method of forming an integrated chip, comprising:
forming a first sacrificial structure and a second sacrificial structure over a substrate;
forming a plurality of select gates along opposing sides of the first sacrificial structure and the second sacrificial structure;
forming an inter-gate dielectric over the plurality of select gates, the first sacrificial structure, and the second sacrificial structure;
forming a memory gate layer over the inter-gate dielectric; and
etching the memory gate layer to define a plurality of memory gates respectively having a topmost point below a top of the first sacrificial structure or the second sacrificial structure, wherein the plurality of memory gates are disposed between closest neighboring ones of the plurality of select gates and are separated from one another by a distance that is between the closest neighboring ones of the plurality of select gates.

16. The method of claim 15, wherein the plurality of memory gates are arranged along a first sidewall and a second sidewall of the inter-gate dielectric, the first sidewall and the second sidewall facing one another.

17. The method of claim 16, further comprising:
forming a doped region within an upper surface of the substrate;
wherein a first one of the plurality of memory gates is arranged along a first side of the doped region and separates the doped region from a first one of the plurality of select gates; and
wherein a second one of the plurality of memory gates is arranged along a second side of the doped region and separates the doped region from a second one of the plurality of select gates.

18. The method of claim 15, further comprising:
performing a first etching process on the inter-gate dielectric after forming the plurality of memory gates; and
performing a second etching process on the inter-gate dielectric after the first etching process is completed.

19. The method of claim 15, further comprising:
forming a dielectric material over a top of the inter-gate dielectric, the plurality of select gates, and the plurality of memory gates; and
performing an etching process that completely removes the dielectric material from over the plurality of select gates and the plurality of memory gates, wherein after the etching process the dielectric material remains directly over the inter-gate dielectric.

20. The method of claim 19,
wherein an imaginary horizontal plane that is parallel to an upper surface of the substrate extends along a top of one or more of the plurality of memory gates; and
wherein the dielectric material is directly between the inter-gate dielectric and the imaginary horizontal plane.

* * * * *